(12) United States Patent
Norley et al.

(10) Patent No.: US 6,503,626 B1
(45) Date of Patent: Jan. 7, 2003

(54) GRAPHITE-BASED HEAT SINK

(75) Inventors: Julian Norley, Chagrin Falls, OH (US); Jing-Wen Tzeng, Huntington Beach, OH (US); Jeremy Klug, Brunswick, OH (US)

(73) Assignee: Graftech Inc., Wilmington, DE (US)

( * ) Notice: Subject to any disclaimer, the term of this patent is extended or adjusted under 35 U.S.C. 154(b) by 0 days.

(21) Appl. No.: 09/595,754

(22) Filed: Jun. 16, 2000

Related U.S. Application Data (63) Continuation-in-part of application No. 09/513,001, filed on Feb. 25, 2000.

(51) Int. Cl.$^7$ ................................................ B32B 9/00
(52) U.S. Cl. ..................... 428/408; 428/131; 361/709; 165/185; 165/905; 165/907; 257/712; 257/722; 264/118; 264/119; 264/128; 264/239
(58) Field of Search ................................. 428/408, 131; 361/709; 165/905, 907, 185; 257/712, 722; 264/109, 118, 119, 128, 239, 340; 423/414

(56) References Cited

U.S. PATENT DOCUMENTS

| | | | |
|---|---|---|---|
| 3,404,061 A | 10/1968 | Shane et al. ............... 161/125 |
| 4,878,152 A | * 10/1989 | Sauzade et al. |
| 4,895,713 A | 1/1990 | Greinke et al. ............. 423/448 |
| 5,523,260 A | * 6/1996 | Missele |
| 5,542,471 A | * 8/1996 | Dickinson |
| 5,582,781 A | 12/1996 | Hayward ..................... 264/28 |
| 5,766,765 A | * 6/1998 | Inoue et al. |
| 5,882,570 A | 3/1999 | Hayward ..................... 264/328 |
| 5,902,762 A | 5/1999 | Mercuri et al. ............... 501/99 |
| 6,131,651 A | * 10/2000 | Richey, III |
| 6,208,513 B1 | * 3/2001 | Fitch et al. |

FOREIGN PATENT DOCUMENTS

| | | |
|---|---|---|
| EP | 805463 A1 | 11/1997 |
| JP | 62285974 | 12/1987 |
| JP | 2160891 | 6/1990 |

OTHER PUBLICATIONS

International Publication No.: WO 00/54953, Publication Date: Sep. 21, 2000, International Application No.: PCT/US00/06918, Filed: Mar. 15, 2000, Inventor: T.P. Hayward, Title: Graphite Foam Material and Method of Making Same.

* cited by examiner

Primary Examiner—Deborah Jones
Assistant Examiner—Wendy Boss
(74) Attorney, Agent, or Firm—James R. Cartigia (57) ABSTRACT

The present invention relates to a system for managing the heat from a heat source like an electronic component. More particularly, the present invention relates to a system effective for dissipating the heat generated by an electronic component using a heat sink formed from a compressed, comminuted particles of resin-impregnated flexible graphite mat or sheet.

10 Claims, 3 Drawing Sheets

GRAPHITE-BASED HEAT SINK

This application is a continuation in part of our prior U.S. patent application Ser. No. 09/513,001 entitled "THERMAL MANAGEMENT SYSTEM", filed Feb. 25, 2000.

TECHNICAL FIELD

The present invention relates to a heat sink capable of managing the heat from a heat source like an electronic component. More particularly, the present invention relates to a graphite-based heat sink system effective for dissipating the heat generated by an electronic component.

BACKGROUND OF THE ART

With the development of more and more sophisticated electronic components, including those capable of increasing processing speeds and higher frequencies, having smaller size and more complicated power requirements, and exhibiting other technological advances, such as microprocessors and integrated circuits in electronic and electrical components and systems as well as in other devices such as high power optical devices, relatively extreme temperatures can be generated. However, microprocessors, integrated circuits and other sophisticated electronic components typically operate efficiently only under a certain range of threshold temperatures. The excessive heat generated during operation of these components can not only harm their own performance, but can also degrade the performance and reliability of the overall system and can even cause system failure. The increasingly wide range of environmental conditions, including temperature extremes, in which electronic systems are expected to operate, exacerbates these negative effects.

With the increased need for heat dissipation from microelectronic devices caused by these conditions, thermal management becomes an increasingly important element of the design of electronic products. As noted, both performance reliability and life expectancy of electronic equipment are inversely related to the component temperature of the equipment.

For instance, a reduction in the operating temperature of a device such as a typical silicon semiconductor can correspond to an exponential increase in the reliability and life expectancy of the device. Therefore, to maximize the lifespan and reliability of a component, controlling the device operating temperature within the limits set by the designers is of paramount importance.

Heat sinks are components that facilitate heat dissipation from the surface of a heat source, such as a heat-generating electronic component, to a cooler environment, usually air. In many typical situations, heat transfer between the solid surface of the component and the air is the least efficient within the system, and the solid-air interface thus represents the greatest barrier for heat dissipation. A heat sink seeks to increase the heat transfer efficiency between the components and the ambient air primarily by increasing the surface area that is in direct contact with the air. This allows more heat to be dissipated and thus lowers the device operating temperature. The primary purpose of a heat sink is to help maintain the device temperature below the maximum allowable temperature specified by its designer/manufacturer.

Typically, heat sinks are formed of a metal, especially copper or aluminum, due to the ability of metals like copper to readily absorb heat and transfer it about its entire structure. In many applications, copper heat sinks are formed with fins or other structures to increase the surface area of the heat sink, with air being forced across or through the fins (such as by a fan) to effect heat dissipation from the electronic component, through the copper heat sink and then to the air.

Limitations exist, however, with the use of metallic heat sinks. One limitation relates to the relative isotropy of a metal—that is, the tendency of a metallic structure to distribute heat relatively evenly about the structure. The isotropy of a metal means that heat transmitted to a metallic heat sink becomes distributed about the structure rather than being directed to the fins where most efficient transfer to the air occurs. This can reduce the efficiency of heat dissipation using a metallic (e.g., copper) heat sink. Moreover, this relative isotropy is not readily controlled or varied, and provides no opportunity for preferentially directing heat.

In addition, the use of copper or aluminum heat sinks can present a problem because of the weight of the metal, particularly when the heating area is significantly smaller than that of the heat sink. For instance, pure copper weighs 8.96 grams per cubic centimeter (g/cc) and pure aluminum weighs 2.70 g/cc (compare with graphite articles, which typically weigh between about 1.4 and 1.8 g/cc). In many applications, several heat sinks need to be arrayed on, e.g., a circuit board to dissipate heat from a variety of components on the board. If metallic heat sinks are employed, the sheer weight of the metal on the board can increase the chances of the board cracking or of other equally undesirable effects, and increases the weight of the component itself.

What is desired, therefore, is a heat sink system effective for dissipating heat from a heat source such as an electronic component. The heat sink system should advantageously be relatively anisotropic, and more preferably have controllable anisotropic (i.e., controllable directional thermal conductivity) characteristics, as compared to a metal like copper or aluminum and exhibit a relatively high ratio of thermal conductivity to weight.

SUMMARY OF THE INVENTION

It is an object of the present invention is to provide a heat sink system exhibiting a relatively high degree of anisotropy.

Another object of the present invention is to provide a heat sink system exhibiting controllable isotropy/anisotropy.

Yet another object of the present invention is to provide a heat sink system having a relatively high ratio of thermal conductivity to weight.

Another object of the present invention is to provide a heat sink system that can be fabricated so as to locate the heat dissipation surfaces thereof so as to control and/or maximize the dissipation of heat from the heat source.

These objects and others that will become apparent to the artisan upon review of the following description can be accomplished by providing a heat sink which comprises a graphite article shaped so as to provide a heat collection surface and at least one heat dissipation surface, wherein arranging the heat collection surface of the graphite article in operative connection with a heat source facilitates dissipation of heat from the heat source through the at least one heat dissipation surface of the graphite article. The heat sink of this invention comprises particles of a comminuted resin-impregnated flexible sheet of expanded graphite, compressed into a desired shape.

Graphites are made up of layer planes of hexagonal arrays or networks of carbon atoms. These layer planes of hexagonally arranged carbon atoms are substantially flat and are oriented or ordered so as to be substantially parallel and equidistant to one another. The substantially flat, parallel equidistant sheets or layers of carbon atoms, usually referred to as basal planes, are linked or bonded together and groups thereof are arranged in crystallites. Highly ordered graphites consist of crystallites of considerable size, the crystallites being highly aligned or oriented with respect to each other and having well ordered carbon layers. In other words, highly ordered graphites have a high degree of preferred crystallite orientation. Graphites possess anisotropic structures and thus exhibit or possess many properties such as thermal conductivity that are highly directional. Briefly, graphites may be characterized as laminated structures of carbon, that is, structures consisting of superposed layers or laminae of carbon atoms joined together by weak van der Waals forces. In considering the graphite structure, two sets of axes or directions are usually noted, to wit, the "c" axis or direction and the "a" axes or directions. For simplicity, the "c" axis or direction may be considered as the direction perpendicular to the carbon layers. The "a" axes or directions may be considered as the directions parallel to the carbon layers (parallel to the planar direction of the crystal structure of the graphite) or the directions perpendicular to the "c" direction.

As noted above, the bonding forces holding the parallel layers of carbon atoms together are only weak van der Waals forces. Graphites can be treated so that the spacing between the superposed carbon layers or laminae can be appreciably opened up so as to receive, or intercalate, other species between the carbon layers. Upon heating, the intercalated species decompose and volatilize to provide a marked expansion in the direction perpendicular to the layers, that is, in the "c" direction and thus form an expanded graphite structure (also referred to as exfoliated or intumesced graphite) in which the laminar character of the carbon layers is substantially retained.

Graphite flake which has been greatly expanded and more particularly expanded so as to have a final thickness or "c" direction dimension which is up to about 80 or more times the original "c" direction dimension can be formed without the use of a binder into cohesive or integrated articles and flexible graphite sheets of expanded graphite, e.g. webs, papers, strips, tapes, or the like. The formation of graphite particles which have been expanded to have a final thickness or "c" dimension which is up to about 80 or more times the original "c" direction dimension into integrated articles and flexible sheets by compression, without the use of any binding material, is believed to be possible due to the excellent mechanical interlocking, or cohesion, which is achieved between the voluminously expanded graphite particles.

In addition to flexibility, the graphite material, as noted above, has also been found to possess a high degree of anisotropy with respect to thermal conductivity, comparable to the graphite starting material due to orientation of the expanded graphite particles substantially parallel to the opposed faces of the sheet resulting from high compression, e.g. roll pressing. Sheet material thus produced has excellent flexibility, good strength and a very high degree of orientation.

Generally, the process of producing flexible, binderless anisotropic graphite sheet material, e.g. web, paper, strip, tape, foil, mat, or the like, comprises compressing or compacting under a predetermined load and in the absence of a binder, expanded graphite particles which have a "c" direction dimension which is up to about 80 or more times that of the original particles so as to form a substantially flat, flexible, integrated graphite sheet. The expanded graphite particles that generally are worm-like or vermiform in appearance, once compressed, will maintain the compression set and alignment with the opposed major surfaces of the sheet. The density and thickness of the sheet material can be varied by controlling the degree of compression. The density of the sheet material can be within the range of from about 0.05 g/cc to about 2.0 g/cc. The flexible graphite sheet material exhibits an appreciable degree of anisotropy due to the alignment of graphite particles parallel to the major opposed, parallel surfaces of the sheet, with the degree of anisotropy increasing upon roll pressing of the sheet material to increased density. In roll pressed anisotropic sheet material, the thickness, i.e. the direction perpendicular to the opposed, parallel sheet surfaces comprises the "c" direction and the directions ranging along the length and width, i.e. along or parallel to the opposed, major surfaces comprising the "a" directions and the thermal properties of the sheet are very different, by more than an order of magnitude, for the "c" and "a" directions (i.e., about 7 watts per meter-° C. (W/m° C.) vs. about 150–200 W/m° C.).

With respect to thermal properties, the thermal conductivity of a flexible graphite sheet in a direction parallel to the upper and lower surfaces of the flexible graphite sheet is relatively high, while it is relatively very low in the "c" direction transverse to the upper and lower surfaces, by a ratio that can approach 20 to one or higher.

BRIEF DESCRIPTION OF THE DRAWINGS

The present invention will be better understood and its advantages more apparent in view of the following detailed description, especially when read with reference to the appended drawings, wherein.

DETAILED DESCRIPTION OF THE PREFERRED EMBODIMENT

Referring to the drawings in detail, a heat sink system prepared in accordance with the present invention is shown and generally designated by the reference numeral 10. It should be noted that for the sake of clarity not all the components and elements of system 10 may be shown and/or marked in all the drawings. Also, as used in this description, the terms "up," "down," "top," "bottom," etc. refer to heat sink 10 when in the orientation shown in FIGS. 1 and 3. However, the skilled artisan will understand that heat sink 10 can adopt any particular orientation when in use.

Heat sink 10 is intended to be used to facilitate the dissipation of heat from a heat source, more particularly from an electronic component 100. Electronic component 100 can comprise any electronic device or component that produces sufficient heat to interfere with the operation of electronic component 100 or the system of which electronic component 100 is an element, if not dissipated. Electronic component 100 can comprise a microprocessor or computer chip, an integrated circuit, control electronics for an optical device like a laser or a field-effect transistor (FET), or components thereof, or other like electronic element. Electronic component 100 includes at least one surface 100a (denoted an "external surface") from which heat radiates and which can be used as a source of heat to be dissipated from electronic component 100.

Figure 1:
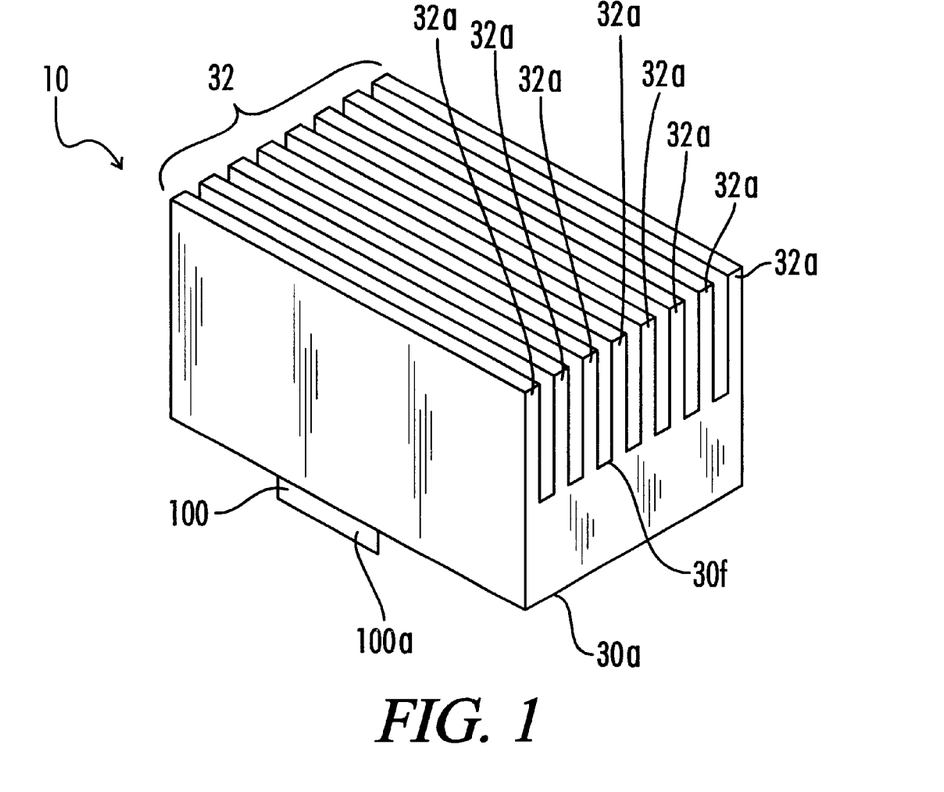
FIG. 1 is a top perspective view of an embodiment of a heat sink in accordance with the present invention.
Figure 3:
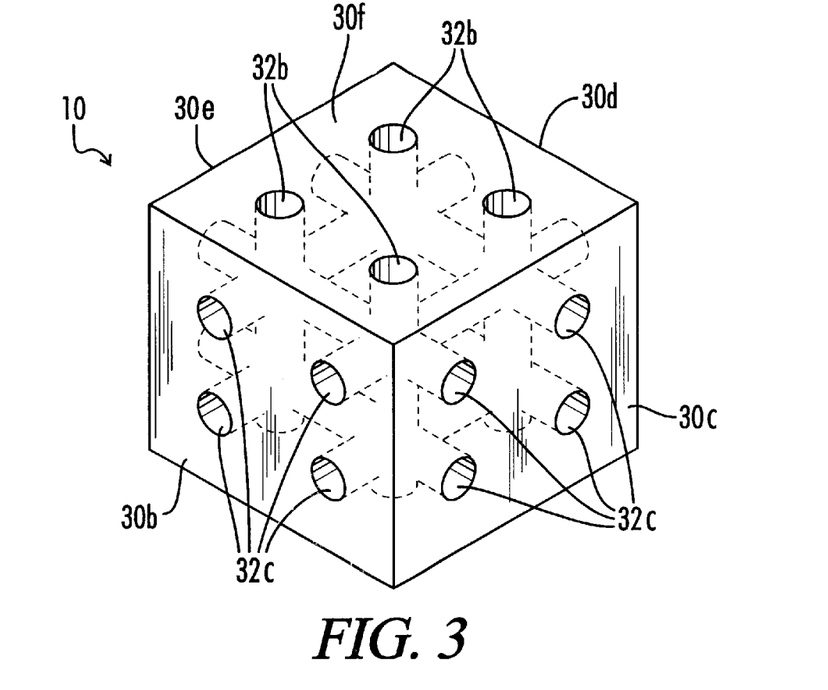
FIG. 3 is a side perspective view of yet another embodiment of a heat sink in accordance with the present invention.

Referring now to FIGS. 1 and 3, heat sink 10 comprises a graphite article formed from a resin-impregnated anisotropic flexible graphite sheet, which has been comminuted, formed and cured into the desired shape. By an anisotropic flexible graphite sheet is meant a sheet of compressed, exfoliated graphite, especially natural graphite. As discussed above, graphite is a crystalline form of carbon comprising atoms covalently bonded in flat layered planes with weaker bonds between the planes. By treating particles of graphite, such as natural graphite flake, with an intercalant of, e.g. a solution of sulfuric and nitric acid, the crystal structure of the graphite reacts to form a compound of graphite and the intercalant. The treated particles of graphite are referred to as "particles of intercalated graphite." Upon exposure to high temperature, the particles of intercalated graphite expand in dimension as much as about 80 or more times their original volume in an accordion-like fashion in the "c" direction, i.e. in the direction perpendicular to the crystalline planes of the graphite. The exfoliated graphite particles are vermiform in appearance, and are therefore commonly referred to as worms. The worms may be compressed together into flexible sheets that, unlike the original graphite flakes, can be formed and cut into various shapes.

Graphite starting materials suitable for use in the present invention include highly graphitic carbonaceous materials capable of reversibly intercalating alkali metals. These highly graphitic carbonaceous materials have a degree of graphitization above about 0.80 and most preferably about 1.0. As used in this disclosure, the term "degree of graphitization" refers to the value g according to the formula:

$$g = \frac{3.45 - d(002)}{0.095}$$

where d(002) is the spacing between the graphitic layers of the carbons in the crystal structure measured in Angstrom units. The spacing d between graphite layers is measured by standard X-ray diffraction techniques. The positions of diffraction peaks corresponding to the (002), (004) and (006) Miller Indices are measured, and standard least-squares techniques are employed to derive spacing which minimizes the total error for all of these peaks. Examples of highly graphitic carbonaceous anode materials include synthetic graphites and natural graphites from various sources, as well as other carbonaceous materials such as petroleum cokes heat treated at temperatures above 2500° C., carbons prepared by chemical vapor deposition or pyrolysis of hydrocarbons and the like.

The graphite starting materials used in the present invention may contain non-carbon components so long as the crystal structure of the starting materials maintains the required degree of graphitization. Generally, any carbon-containing material, the crystal structure of which possesses the required degree of graphitization, is suitable for use with the present invention. Such graphite preferably has an ash content of less than six weight percent.

A common method for manufacturing graphite sheet is described by Shane et al. in U.S. Pat. No. 3,404,061, the disclosure of which is incorporated herein by reference. In the typical practice of the Shane et al. method, natural graphite flakes are intercalated by dispersing the flakes in a solution containing e.g., a mixture of nitric and sulfuric acid, advantageously at a level of about 50 to about 300 parts by weight of intercalant solution per 100 parts by weight of graphite flakes (pph). The intercalation solution contains oxidizing and other intercalating agents known in the art. Examples include those containing oxidizing agents and oxidizing mixtures, such as solutions containing nitric acid, potassium chlorate, chromic acid, potassium permanganate, potassium chromate, potassium dichromate, perchloric acid, and the like, or mixtures, such as for example, concentrated nitric acid and chlorate, chromic acid and phosphoric acid, sulfuric acid and nitric acid, or mixtures of a strong organic acid, e.g. trifluoroacetic acid, and a strong oxidizing agent soluble in the organic acid. Alternatively, an electric potential can be used to bring about oxidation of the graphite. Chemical species that can be introduced into the graphite crystal using electrolytic oxidation include sulfuric acid as well as other acids.

In a preferred embodiment, the intercalating agent is a solution of a mixture of sulfuric acid, or sulfuric acid and phosphoric acid, and an oxidizing agent such as nitric acid, perchloric acid, chromic acid, potassium permanganate, hydrogen peroxide, iodic or periodic acids, or the like. Although less preferred, the intercalation solution may contain metal halides such as ferric chloride, and ferric chloride mixed with sulfuric acid, or a halide, such as bromine as a solution of bromine and sulfuric acid or bromine in an organic solvent.

After the flakes are intercalated, any excess solution is drained from the flakes and the flakes are water-washed. The quantity of acid solution (intercalant) retained inside the flakes after draining and washing may range from 5 to 150 parts of solution by V weight per 100 parts by weight of graphite flakes (pph) and more typically about 10 to about 110 pph. Alternatively, the quantity of the intercalant may be limited to between about 10 to about 50 parts of solution per hundred parts of graphite by weight which permits the washing step to be eliminated as taught and described in U.S. Pat. No. 4,895,713, the disclosure of which is also herein incorporated by reference. Upon exposure to high temperature, e.g. temperatures of about 300° C., and especially about 700° C. to about 1000° C. and higher, the particles of intercalated graphite expand as much as about 80 to 1000 or more times their original volume in an accordion-like fashion in the c-direction (in the direction perpendicular to the crystalline planes of the constituent graphite particles) to form expanded graphite particles or worms. The resulting worms may be compressed together into flexible mat or sheets.

Flexible graphite sheet is coherent, with good handling strength, and is suitably compressed, such as by roll-pressing, to a thickness of about 0.025 to about 25 millimeters (mm), more preferably a thickness of about 0.025 to about 4 mm, and a density of about 0.02 to about 2.0 g/cc. From about 1.5 to about 50% by weight of ceramic additives can be blended with the intercalated graphite flakes as described in U.S. Pat. No. 5,902,762 (which is incorporated herein by reference) to provide enhanced resin impregnation in the flexible graphite sheet. The additives include ceramic fiber particles having a length of about 0.15 to about 1.5 mm. The width of the particles is suitably from about 0.04 to about 0.004 mm. The ceramic fiber particles are non-reactive and non-adhering to graphite and are stable at temperatures up to about 1000° C., preferably about 1300° C., or higher. Suitable ceramic fiber particles are formed of macerated quartz glass fibers, carbon and graphite fibers, zirconia, boron nitride, silicon carbide and magnesia fibers, naturally occurring mineral fibers such as calcium metasilicate fibers, calcium aluminum silicate fibers, aluminum oxide fibers and the like.

As noted, the flexible graphite sheet is resin-impregnated, by which is meant that the sheet is impregnated with resin either prior to or subsequent to mechanical calendaring of the sheet and/or comminution of the sheet (most preferably subsequent to mechanical calendaring but prior to comminution of the sheet). Indeed, it is feasible to impregnate the flexible graphite sheet by admixing exfoliated graphite "worms" with resin prior to formation of the flexible graphite sheet. The absorbed resin, after curing, provides dimensional stability of the final graphite article, as well as its ability to be machined to precise shapes. Typical resin systems for this purpose include diglycidyl ether of bisphenol A based epoxies or novolac epoxy systems, cured with a variety of curing agents, such as a powdered amine, anhydride or Lewis acid as curatives/catalysts. Suitable resin content is preferably about 10% to about 60%, more preferably about 15% to about 45%, by weight.

Figure 5:
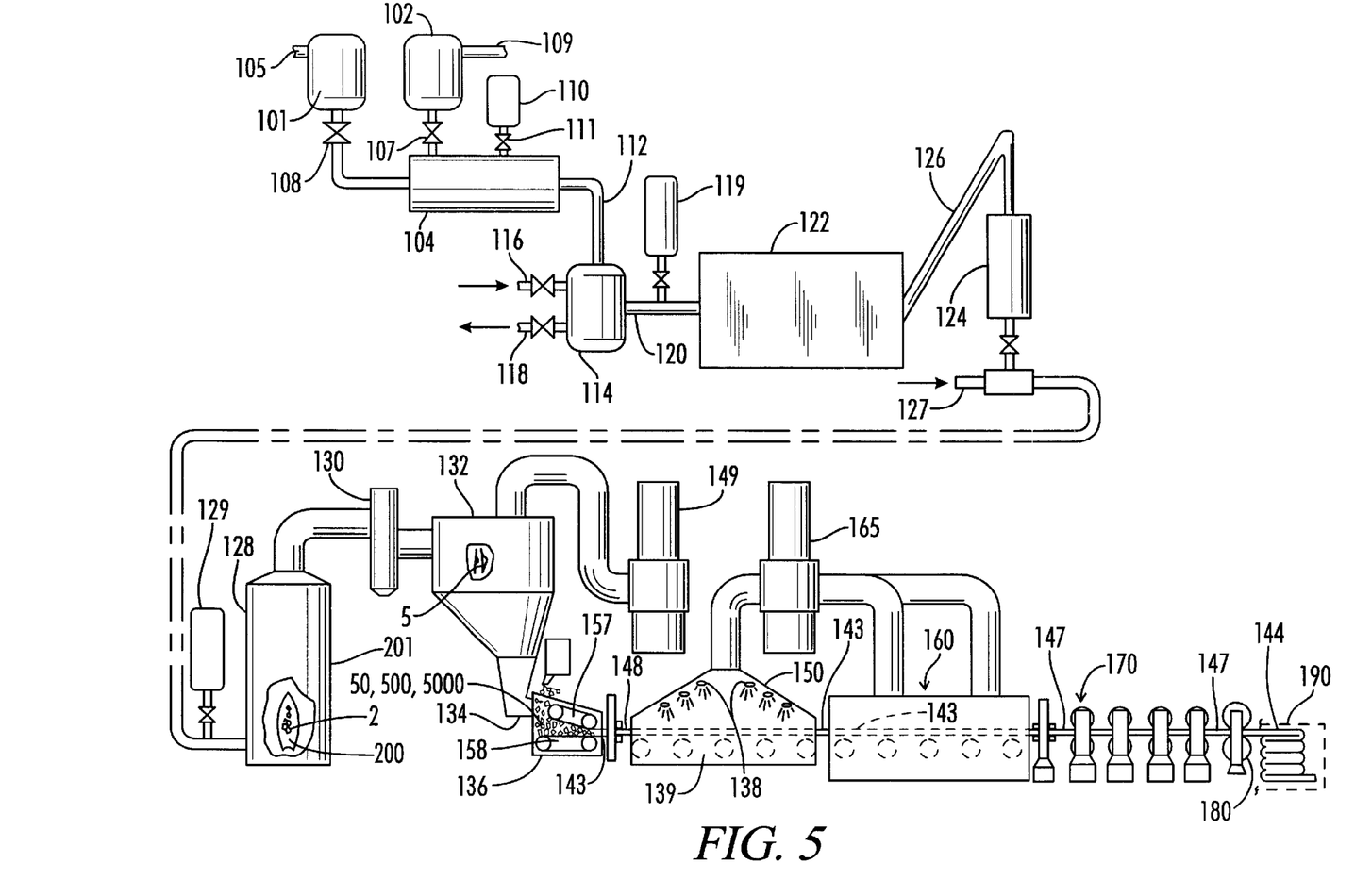
FIG. 5 illustrates a system for the continuous production of resin-impregnated flexible graphite sheet.

In one embodiment, and referring now to FIG. 5, a particular method for producing resin-impregnated flexible sheet involves charging graphite flakes and a liquid intercalating agent into reactor 104. More particularly, a vessel 101 is provided for containing a liquid intercalating agent. Vessel 101, suitably made of stainless steel, can be continually replenished with liquid intercalant by way of conduit 106. Vessel 102 contains graphite flakes that, together with intercalating agents from vessel 101, are introduced into reactor 104. The respective rates of input into reactor 104 of intercalating agent and graphite flake are controlled, such as by valves 108, 107. Graphite flake in vessel 102 can be continually replenished by way of conduit 109. Additives, such as intercalation enhancers, e.g., trace acids, and organic chemicals may be added by way of dispenser 110 that is metered at its output by valve 111.

The graphite flakes in reactor vessel 104 are subjected to interlayer attack by the acid mixture intercalant, as described in U.S. Pat. No. 3,404,061 to Shane et al. The resulting intercalated graphite particles are acid coated and are conducted (such as via conduit 112) to a wash tank 114 where the particles are washed, advantageously with water which enters and exits wash tank 114 at 116, 118. The washed intercalated graphite flakes are then passed to drying chamber 122 such as through conduit 120. Additives such as buffers, antioxidants, pollution reducing chemicals can be added from vessel 119 to the flow of intercalated graphite flake for the purpose of modifying the surface chemistry of the exfoliate during expansion and use and modifying the gaseous emissions which cause the expansion.

The intercalated graphite flake is dried in dryer 122, preferably at temperatures of about 75 to about 150° C., generally avoiding any intumescence or expansion of the intercalated. graphite flakes. After drying, the intercalated graphite flakes are fed as a stream into flame 200, by, for instance, being continually fed to collecting vessel 124 by way of conduit 126 and then fed as a stream into flame 200 in expansion vessel 128 as indicated at 2. Additives such as ceramic fiber particles formed of macerated quartz glass fibers, carbon and graphite fibers, zirconia, boron nitride, silicon carbide and magnesia fibers, naturally occurring mineral fibers such as calcium metasilicate fibers, calcium aluminum silicate fibers, aluminum oxide fibers and the like can be added from vessel 129 to the stream of intercalated graphite particles propelled by entrainment in a non-reactive gas introduced at 127.

The intercalated graphite particles 2, upon passage through flame 200 in expansion chamber 201, expand up to or more than 80 times in the "c" direction and assume a "worm-like" expanded form; any additives introduced from 129 and blended with the stream of intercalated graphite particles are essentially unaffected by passage through the flame 200. The expanded graphite particles may pass through a gravity separator 130, in which heavy ash natural mineral particles are separated from the expanded graphite particles, and then into a wide topped hopper 132. Separator 130 can be by-passed when not needed.

The expanded, i.e., exfoliated graphite particles fall freely in hopper 132 together with any additives, and are randomly dispersed and passed into compression station 136, such as through trough 134. Compression station 136 comprises opposed, converging, moving porous belts 157, 158 spaced apart to receive the exfoliated, expanded graphite particles 50, 500, 5000. Due to the decreasing space between opposed moving belts 157, 158, the exfoliated expanded graphite particles are compressed into a mat of flexible graphite, indicated at 148 having thickness of, e.g., from about 25 to 7.5, especially from about 25 to 4.5 mm, and a density of from about 0.02 to about 1.0 g/cc. Gas scrubber 149 may be used to remove and clean gases emanating from the expansion chamber 201 and hopper 132.

The mat 148 is passed through vessel 150 and is impregnated with resin (such as "neat" resin or resin in a solvated system) from spray nozzles 138, the impregnant advantageously being "pulled through the mat" by means of vacuum chamber 139 and the resin is thereafter preferably dried in dryer 160 reducing the tack of the resin and the resin impregnated mat 143 is thereafter densified into roll pressed flexible graphite sheet 147 in calender mill 170 (as noted above, mat is a form a flexible graphite sheet; generally speaking, mat is flexible graphite sheet which has not been calendared so as to provide increased flexibility). Gases and fumes from vessel 150 and dryer 160 are preferably collected and cleaned in scrubber 165.

Depending on the nature of the resin system employed, and especially the solvent type and level employed, a vaporization drying step may be included. In this drying step, the resin impregnated flexible graphite sheet is exposed to heat to vaporize and thereby remove some or all of the solvent, without effecting cure of the resin system. In this way, blistering during the curing step, which can be caused by vaporization of solvent trapped within the sheet is avoided. The degree and time of heating will vary with the nature and amount of solvent, and is preferably at a temperature of at least about 70° C. and more preferably from about 70° C. to about 125° C. for about 3 to about 20 minutes for this purpose.

Once the resin-impregnated flexible graphite sheet is prepared, it is then comminuted by known processes or devices, such as a ball mill, jet mill, air mill, blender, etc. to produce particles. Preferably, a majority of the particles have a diameter such that they will pass through 20 U.S. mesh; more preferably a major portion (greater than about 20%, most preferably greater than about 50%) will not pass through 80 U.S. mesh. It may be desirable to cool the resin-impregnated flexible graphite sheet as it is being comminuted to avoid heat damage to the resin system during the comminution process.

The size of the comminuted particles should be chosen so as to balance machinability and formability of the graphite article with the thermal characteristics desired. Thus, smaller particles will result in a graphite article which is easier to machine and/or form, whereas larger particles will result in a graphite article having higher anisotropy, and, therefore, greater in-plane thermal conductivity, as shown in the Table below. Accordingly, the artisan should in most instances employ the largest particles which permit forming and machining to the degree necessary.

Once the resin-impregnated flexible graphite sheet is comminuted, it is compressed into the desired shape and then cured in the preferred embodiment. Alternatively, the sheet can be cured prior to being comminuted, although post-comminution cure is preferred. Compression can be by die pressing, isostatic molding or other like compression processes. Interestingly, the isotropy/anisotropy of the final article can be varied by the compression (or molding) pressure, the particular molding process utilized and the size of the particles. For instance, die pressing will result in a more anistropic final product than isostatic molding. Likewise, an increase in molding pressure (and hence an increase in the density of the material) will also result in an increase in anisotropy. Thus, adjustment of molding process and molding pressure, as well as selection of comminuted particle size, can lead to controllable variations in isotropy/anisotropy. This can be used to control heat conduction of heat sink 10, to most efficiently dissipate heat from electronic component 100. In other words, control of isotropy/anisotropy can be used to direct heat from electronic component 100 to the surfaces of heat sink 10 where heat dissipation is best/most desired. Typical molding pressures employed range from under about 1000 pounds per square inch (psi) to at least abut 35,000 psi.

Heat sink 10 of the present invention is shaped so as to provide a heat collection surface 30a and at least one heat dissipation surface 32. When heat collection surface 30a of heat sink 10 is in operative connection with a heat source, i.e., external surface 100a of electronic component 100, heat is dissipated from external surface 100a through the at least one heat dissipation surface 32 of heat sink 10.

Heat dissipation surface as used herein refers to an area of heat sink 10 from which the heat transmitted to heat sink 10 from external surface 100a (either directly or through a thermal interface) is dissipated into the environment. Most commonly, the at least one heat dissipation surface 32 of heat sink 10 are those surfaces of heat sink 10 where air or another coolant fluid is passed across heat sink 10 such as by the action of a fan (not shown). To maximize heat transfer from heat sink 10 to the coolant fluid, the at least one heat dissipation surface 32 of heat sink 10 should be designed and/or shaped so as to have as great a surface area as feasible.

Figure 2:
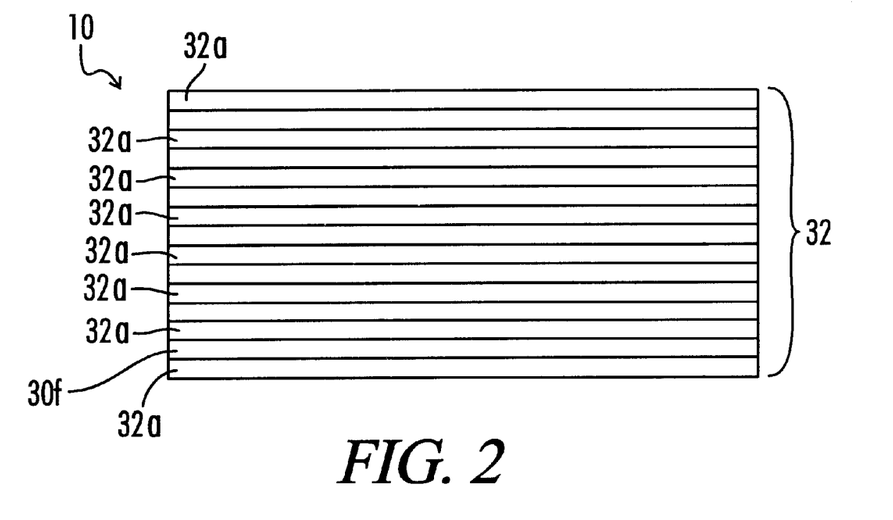
FIG. 2 is a top plan view of the heat sink of FIG. 1.
Figure 4:
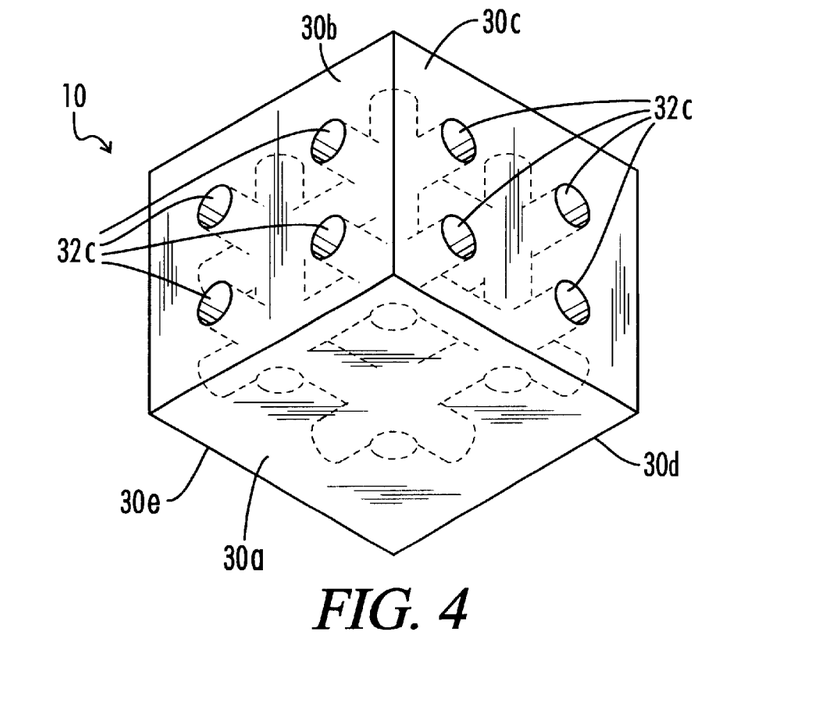
FIG. 4 is a bottom perspective view of the heat sink of FIG. 3.

For instance, and as illustrated in FIGS. 1 and 2, the at least one heat dissipation surface 32 of heat sink 10 comprises fins 32a formed at a surface of heat sink 10 opposite heat collection surface 30a, such that heat travels from heat collection surface 30a to fins 32a, where air or other coolant passing across fins 32a can absorb the heat from fins 32a and thereby carry it away (and, by extension, away from electronic component 100). The number and size and shape of fins 32a can be chosen by the practitioner to achieve a balance between coolant flow and surface area. For instance, more fins 32a, each of which is thinner with less space therebetween, will provide increased surface area, but may interfere with coolant flow; likewise, fewer, larger fins 32a, with greater space therebetween will result in greater thermal convection efficiency but less surface area. In a preferred embodiment, where heat sink 10 is shaped as a block (in other words, a cube) whose walls are each about 2.5 mm long (and generally no more than about 50 mm long, although this will vary depending on the size of electronic component 100), as shown in FIGS. 4 and 5, a "top" wall 30f will have a plurality, and most commonly about 2 to 15, fins 32a extending therefrom, each fin 32a being about 12 to 38 mm in height ("h") and abut 0.25 to 9 mm in thickness ("t"), with the distance therebetween depending on the dimensions of heat sink 10 and the number and size of fins 32a. Of course, as noted above, the particular dimensions of heat sink 10 and fins 32a will vary depending on the particular application and desires of the practitioner.

In another embodiment, illustrated in FIGS. 3 and 4, heat sink 10 has structural features comprising cavities 32b, conduits therethrough 32c or combinations of cavities 32b and conduits therethrough 32c, where the at least one heat dissipation surface 32 of heat sink 10 comprises surfaces of the cavities 32b and/or conduits 32c. Cavities 32b are useful for increasing the surface area of heat sink 10, by extending down through the top 30f of heat sink 10 (in the orientation shown in FIG. 3) towards but not through heat collection surface 30a (clearly, if cavities 32b extend through heat collection surface 30a, the effectiveness of heat sink 10 may be reduced since the area of operative connection between external surface 100a of electronic component 100 and heat collection surface 30a of heat sink 10 would be reduced). Cavities 32b can be of any particular size and shape as desired by the artisan, to produce the desired amount of heat dissipation. The walls (i.e., surfaces) of cavities 32b function as some of the at least one heat dissipation surface 32 of heat sink 10.

Likewise, conduits 32c run through heat sink 10 so as to not reduce the surface area of heat collection surface 30a. Conduits 32c can assume any particular shape or size, provided they permit coolant flow therethrough. Preferably, conduits 32c interact and intersect with cavities 32b and with each other so as to permit and maximize coolant flow through cavities 32b also. Again, the surfaces of conduits 32c function as some of the at least one heat dissipation surfaces 32 of heat sink 10. The number and size and shape of cavities 32b and conduits 32c can be chosen by the practitioner to achieve a balance between coolant flow and surface area. For instance, smaller (in diameter), but more in number, cavities 32b and conduits 32c will result in greater surface area but reduced coolant flow (because of the fluid dynamics involved in achieving fluid flow through a small diameter opening); larger, but fewer in number, cavities 32b and conduits 32c will lead to reduced surface area but greater coolant flow.

In a preferred embodiment, where heat sink 10 is shaped as a block (in other words, a cube) whose walls are each about 2.5 mm long (and in many cases, not more than about 50 mm long), as shown in FIGS. 3 and 4, "side" walls 30b, 30c, 30d and 30e will each have at least one and preferably about 3 to 6 conduits 32c extending therethrough (clearly, opposing side walls will "share" conduits 32c, with one conduit opening appearing in one side wall, such as 30b, and the corresponding other conduit opening appearing in the opposite side wall, such as 30d). Likewise, "top" wall 30f of heat sink 10 will have at least one and preferably about 3 to 6 cavities 32b extending therein, and through heat sink 10, but not opening into heat collection surface 30a opposite top wall 32f, as discussed above. Cavities 32b and conduits 32c should each have a diameter of about 0.75 to about 13 mm or larger (depending on the dimensions of heat sink 10). Of course, as noted above, the particular dimensions of heat sink 10 and cavities 32b and conduits 32c will vary depending on the particular application and desires of the practitioner.

As noted above, heat sink 10 comprises a graphite article. Advantageously, heat sink 10 is formed from compressed particles of resin-impregnated comminuted flexible graphite sheet or mat. Blocks formed from particles of exfoliated graphite can be compressed into the desired shapes, with fins 32a, etc. Alternatively, heat sink 10 formed from particles of resin-impregnated comminuted flexible graphite sheet compressed into a block or other shape and then machined into a desired shape and/or otherwise treated (such as punched) so as to have fins 32a, cavities 32b and/or conduits 32c, as desired. Typically, heat sink 10 is formed by die pressing or isostatic pressing of the comminuted particles, followed by the required machining, etc.

Depending on the particular application in which heat sink 10 is to be employed, it may also be desirable to provide a protective coating on heat sink 10, to prevent graphite from flaking or breaking off and interfering with electronic component 100. Although not believed necessary in the vast majority of circumstances, such protective coatings can include conductive coatings, such as nickel plating.

Heat sink 10 can be mounted to electronic component 100 by conventional means, such as by mounting directly to electronic component 100 using an adhesive, such as a pressure sensitive or thermally activated adhesive (something which the relatively low weight of graphite permits); mounting to a thermal interface, if present, such as by an adhesive; or mounting to the board or other object on which electronic circuit 100 is mounted, provided heat collection surface 30a of heat sink 10 is operatively connected to external surface 100a of electronic component 100 (directly or through thermal interface 20).

The use of graphite to form heat sink 10 has many significant advantages. As discussed, the anisotropic nature of graphite allows the practitioner to direct the heat from external surface 100a of electronic component 100 to the at least one heat dissipation surface 32. Graphite materials have the further advantage of relatively low density, and thus relatively low weight. For instance, articles formed from exfoliated graphite particles generally have a density below about 1.3 g/cc. High density graphite articles have a density below about 1.9 g/cc. When compared with the density of copper—approximately 8.9 g/cc for pure copper—a graphite article of the same approximate size and volume of a copper article will weight significantly less.

The weight advantage of graphite over copper or other metals can be expressed in terms of their respective thermal conductivity. If one considers thermal conductivity per unit weight (sometimes referred to in the art as specific thermal conductivity, although the term may be a misnomer), the exfoliated graphite heat sinks of the present invention have a specific thermal conductivity in the direction of high conductivity of about 0.134 watts-meter$^2$ per kilogram-° C. (Wm$^2$/kg° C.) to about 0.184 Wm$^2$/kg° C., whereas copper heat sinks have a specific thermal conductivity of about 0.019 to about 0.051 Wm$^2$/kg° C. (for a specific thermal conductivity of 0.051, the heat sink would have to be formed of pure copper). Thus, per unit weight, graphite heat sinks can be far more effective at heat dissipation from electronic component 100, without the disadvantages of "loading" a circuit board or other component with excess weight. When the further advantages provided by the anisotropic nature of graphite are considered, heat sinks 10 of the present invention are distinctly advantageous.

The following example is presented to further illustrate and explain the present invention and should not be viewed as limiting in any regard.

EXAMPLE

Heat sinks in accordance with the present invention were prepared by forming flexible graphite sheet by intercalating natural graphite flake, exfoliating the natural graphite flake by exposing the flake to a flame to form exfoliated graphite particles, compressing the exfoliated graphite particles to a sheet having a density of about 0.104 g/cc and a thickness of 7.0 mm, and impregnating the sheet with an epoxy resin system comprising a liquid diglycidyl ether of bisphenol A (DGEBA) resin, a solid DGEBA resin, a latent powdered amine-containing curative and a substituted urea accelerator. The resulting sheet was then comminuted and compressed into a block or bar by either die pressing to a pressure of 10,000 psi or isomolding to a pressure of 26,000 psi, as indicated. The article was then cured to form an article having about 24–25% resin and the remainder graphite. Several characteristics of the resulting article were measured and the results reproduced below in the Table.

The first heat sink tested was formed from particles that passed through a 20 U.S. mesh but did not pass through a 50 U.S. mesh, and was die-pressed.

The second heat sink tested was formed from particles that passed through a 20 U.S. mesh but about 85% did not pass through an 80 U.S. mesh, and was isomolded.

The third heat sink tested was formed from particles that passed through an 80 U.S. mesh, and was isomolded.

The measured characteristics were compared with accepted values for pure aluminum, isomolded graphite (not expanded) and pure copper, and the values also reproduced below.

TABLE

| | Density g/cm3 | In-Plane Conductivity W/m° C. | Out of Plane Conductivity w/m° C. | In-Plane Specific Conductivity Wm$^2$/kg° C. In-Plane | Out of Plane Specific Conductivity Wm$^2$/kg° C. Out of Plane | Anisotopy Ratio |
|---|---|---|---|---|---|---|
| Die-pressed -20/+50 Mesh | 1.556 | 226 | 8.2 | 0.145 | 0.005 | 27.4 |
| Isomolded-20 Mesh | 1.623 | 198 | 40 | 0.122 | 0.025 | 5.0 |
| Isomolded-80 Mesh | 1.568 | 95 | 24 | 0.061 | 0.015 | 4.0 |
| Pure Aluminum | 2.7 | 237 | 237 | 0.028 | 0.028 | 1 |
| Isomolded Graphite | 1.85 | 120 | 120 | 0.065 | 0.065 | 1 |
| Pure Copper | 8.96 | 400 | 400 | 0.045 | 0.045 | 1 |

As is apparent, the inventive heat sinks show in-plane specific conductivity much higher than that of aluminum, copper or isomolded graphite, due, it is believed, to the anisotropy exhibited by the inventive heat sinks. This higher specific conductivity can provide significant advantages where directed heat dissipation is desirable.

The above description is intended to enable the person skilled in the art to practice the invention. It is not intended to detail all of the possible variations and modifications that will become apparent to the skilled worker upon reading the description. It is intended, however, that all such modifications and variations be included within the scope of the invention that is defined by the following claims. The claims are intended to cover the indicated elements and steps in any arrangement or sequence that is effective to meet the objectives intended for the invention, unless the context specifically indicates the contrary.

What is claimed is:

1. A heat sink comprising a graphite article shaped so as to provide a heat collection surface and at least one heat dissipation surface, wherein arranging the heat collection surface of the graphite article in operative connection with a heat source causes dissipation of heat from the heat source through the at least one heat dissipation surface of the graphite article, and further wherein the graphite article is formed from comminuted resin-impregnated flexible natural graphite sheet compressed into the desired shape.

2. The heat sink of claim 1 wherein the at least one heat dissipation surface of the graphite article comprises fins formed at a surface of the graphite article opposite the heat collection surface.

3. The heat sink of claim 1 wherein the graphite article has structural features comprising cavities therein, holes therethrough or combinations of cavities therein and holes therethrough, the at least one heat dissipation surface of the graphite article comprising surfaces of the structural features.

4. The heat sink of claim 1 wherein the graphite article comprises resin-impregnated flexible sheets of compressed particles of exfoliated natural graphite comminuted and then compressed into a desired shape.

5. The heat sink of claim 4 wherein the resin comprises an epoxy resin or a mixture of epoxy resins.

6. A heat sink produced by the process comprising:

a. compressing exfoliated natural graphite particles into a mat having a thickness of about 0.025 to about 25 mm;

b. impregnating the mat with resin to form an impregnated body;

c. comminuting the impregnated body into particles; and d. compressing the particles of impregnated body into a graphite heat sink.

7. The heat sink of claim 6, wherein the mat is compressed into a flexible graphite sheet having a thickness of about 0.025 to about 4 mm prior to impregnation with the resin.

8. The heat sink of claim 6, wherein the impregnated body is compressed into a flexible graphite sheet having a thickness of about 0.025 to about 4 mm prior to being comminuted.

9. The heat sink of claim 6, wherein the impregnated body is comminuted into particles to form particles of impregnated body having an average diameter such that a majority of the particles will pass through a 20 U.S. mesh.

10. The heat sink of claim 6, wherein the heat sink is machined into a desired shape.

* * * * *

UNITED STATES PATENT AND TRADEMARK OFFICE
CERTIFICATE OF CORRECTION

PATENT NO.    : 6,503,626 B1                                                Page 1 of 1
DATED         : January 7, 2003
INVENTOR(S)   : Norley et al.

It is certified that error appears in the above-identified patent and that said Letters Patent is hereby corrected as shown below:

Column 6,
Line 33, "parts of solution by V weight per…" should read as -- parts of solution weight per… --

Column 10,
Line 2, "…and abut 0.25 to 9mm…" should read as -- …and about 0.25 to 9 mm… --

Column 12,
Table, in the table heading of column 4, third line "w/m°C." should read as -- W/m°C. --

Signed and Sealed this

Thirteenth Day of May, 2003

JAMES E. ROGAN
*Director of the United States Patent and Trademark Office*